US010886661B2

(12) United States Patent
Liu et al.

(10) Patent No.: US 10,886,661 B2
(45) Date of Patent: Jan. 5, 2021

(54) CONNECTOR AND RADIATOR

(71) Applicant: Tyco Electronics (Shanghai) Co. Ltd., Shanghai (CN)

(72) Inventors: WenYu Liu, Shanghai (CN); Hongqiang Han, Shanghai (CN); Lizhou Li, Shanghai (CN); Jiwang Jin, Shanghai (CN); Xingjie Ge, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 16/351,680

(22) Filed: Mar. 13, 2019

(65) Prior Publication Data

US 2019/0288448 A1  Sep. 19, 2019

(30) Foreign Application Priority Data

Mar. 14, 2018  (CN) .................... 2018 2 0347511 U

(51) Int. Cl.
| H01R 13/627 | (2006.01) |
| H01R 13/506 | (2006.01) |
| G06F 1/20 | (2006.01) |
| H01R 13/629 | (2006.01) |
| H05K 7/20 | (2006.01) |
| H01R 13/533 | (2006.01) |

(52) U.S. Cl.
CPC ......... *H01R 13/6271* (2013.01); *G06F 1/20* (2013.01); *H01R 13/506* (2013.01); *H01R 13/533* (2013.01); *H01R 13/629* (2013.01); *H05K 7/20* (2013.01)

(58) Field of Classification Search
CPC .......... H01R 13/6271; H01R 13/504; H01R 13/506; H01R 13/629; F28F 3/06; G02B 6/4269; G02B 6/4246; G06F 1/20; H05K 9/0058; H05K 7/20418; H05K 7/20
USPC ........................................ 439/345
See application file for complete search history.

(56) References Cited

U.S. PATENT DOCUMENTS

| 6,373,704 B1 * | 4/2002 | Chen .................. H01L 23/4093 165/80.3 |
| 6,978,827 B2 * | 12/2005 | Armstrong .......... H01L 23/4093 165/121 |
| 7,529,094 B2 * | 5/2009 | Miller .................. G02B 6/4246 165/185 |
| 7,539,018 B2 * | 5/2009 | Murr .................. H05K 7/20418 165/185 |
| 8,599,559 B1 * | 12/2013 | Morrison ............. H05K 9/0058 361/702 |
| 10,276,995 B2 * | 4/2019 | Little ................... H01R 13/504 |
| 10,455,739 B2 * | 10/2019 | Su ........................ G02B 6/4269 |
| 10,477,729 B2 * | 11/2019 | Han ........................ F28F 3/06 |
| 2007/0183128 A1 * | 8/2007 | Pirillis ................ H05K 9/0058 361/715 |

\* cited by examiner

*Primary Examiner* — Jean F Duverne
(74) *Attorney, Agent, or Firm* — Barley Snyder

(57) ABSTRACT

A connector comprises a cage, a radiator disposed on a top wall of the cage and having a vertical slot extending through the radiator in a lateral direction of the radiator, a clip adapted to be locked to the top wall of the cage, and a sealing cover mounted on the vertical slot. The clip has an elastic lateral beam received in the vertical slot and adapted to press the radiator on the top wall of the cage. The sealing cover at least partially seals the vertical slot.

20 Claims, 5 Drawing Sheets

CONNECTOR AND RADIATOR

CROSS-REFERENCE TO RELATED APPLICATION

This application claims the benefit of the filing date under 35 U.S.C. § 119(a)-(d) of Chinese Patent Application No. 201820347511.4, filed on Mar. 14, 2018.

FIELD OF THE INVENTION

The present invention relates to a connector and, more particularly, to a connector having a radiator.

BACKGROUND

Communication systems commonly transmit data by plug and receptacle assemblies. For example, network systems, servers, data centers, and the like use plug and receptacle assemblies to interconnect the various devices of the communication system. A plug and receptacle assembly typically includes a cable assembly having a pluggable transceiver and a receptacle assembly. The receptacle assembly is designed to receive the pluggable transceiver. The receptacle assembly is typically mounted to a circuit board having one or more integrated circuits, processors, or the like that communicate with the pluggable transceiver through an electrical connector of the receptacle assembly.

The plug and receptacle assembly includes signal pathways and ground pathways. The signal pathways convey data signals and the ground pathways control impedance and reduce crosstalk between the signal pathways. The pluggable transceivers and receptacle assemblies may be configured to transfer electrical signals in accordance with industry standards. By way of example, known industry standards include small-form factor pluggable (SFP), enhanced SFP (SFP+), quad SFP (QSFP), C form-factor pluggable (CFP), and 10 Gigabit SFP, which is often referred to as XFP. These and similar communication systems are referred to herein as SFP-type systems. The pluggable transceivers and receptacle assemblies may be capable of implementing one or more communication protocols. Non-limiting examples of communication protocols that may be implemented include Ethernet, Fibre Channel, InfiniBand, and Synchronous Optical Networking (SONET)/Synchronous Digital Hierarchy (SDH). Pluggable transceivers may be, for example, a direct attach copper (DAC), an active optical cable (AOC), or an optical transceiver (Txcvr).

For many communication systems, such as the SFP-type systems, the receptacle assembly is also designed to absorb thermal energy from the pluggable transceiver and permit the thermal energy to dissipate into the surrounding environment. The receptacle assembly includes a receptacle cage that is designed to receive the pluggable transceiver during a mating operation. The receptacle assembly also includes a thermal-transfer module, which may be referred to as a heat sink, that is positioned along a side of the receptacle cage and includes pins (e.g., projections) that extend into the surrounding environment. The pins receive thermal energy absorbed from the pluggable transceiver and permit the thermal energy to dissipate into the surrounding environment.

Known thermal-transfer modules have been used to effectively transfer thermal energy from the plug and receptacle assemblies. There is a desire, however, to increase the speed and signal lane density of plug and receptacle assemblies. For example, current SFP-type systems may be configured to transfer data at 25 gigabits per second (Gbps). More recently developed systems are capable of transferring data at 50 Gbps or more, and it is predicted that transfer speeds will continue to increase. At the same time, signal lane density has increased. As the transfer speeds and signal lane densities increase, however, the thermal energy generated by the communication system also increases. Current thermal-transfer modules are not capable of sufficiently transferring the thermal energy generated by the more recently developed communication systems. Communication systems that are not capable of sufficiently transferring the thermal energy are more vulnerable to performance issues, including failure.

SUMMARY

A connector comprises a cage, a radiator disposed on a top wall of the cage and having a vertical slot extending through the radiator in a lateral direction of the radiator, a clip adapted to be locked to the top wall of the cage, and a sealing cover mounted on the vertical slot. The clip has an elastic lateral beam received in the vertical slot and adapted to press the radiator on the top wall of the cage. The sealing cover at least partially seals the vertical slot.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
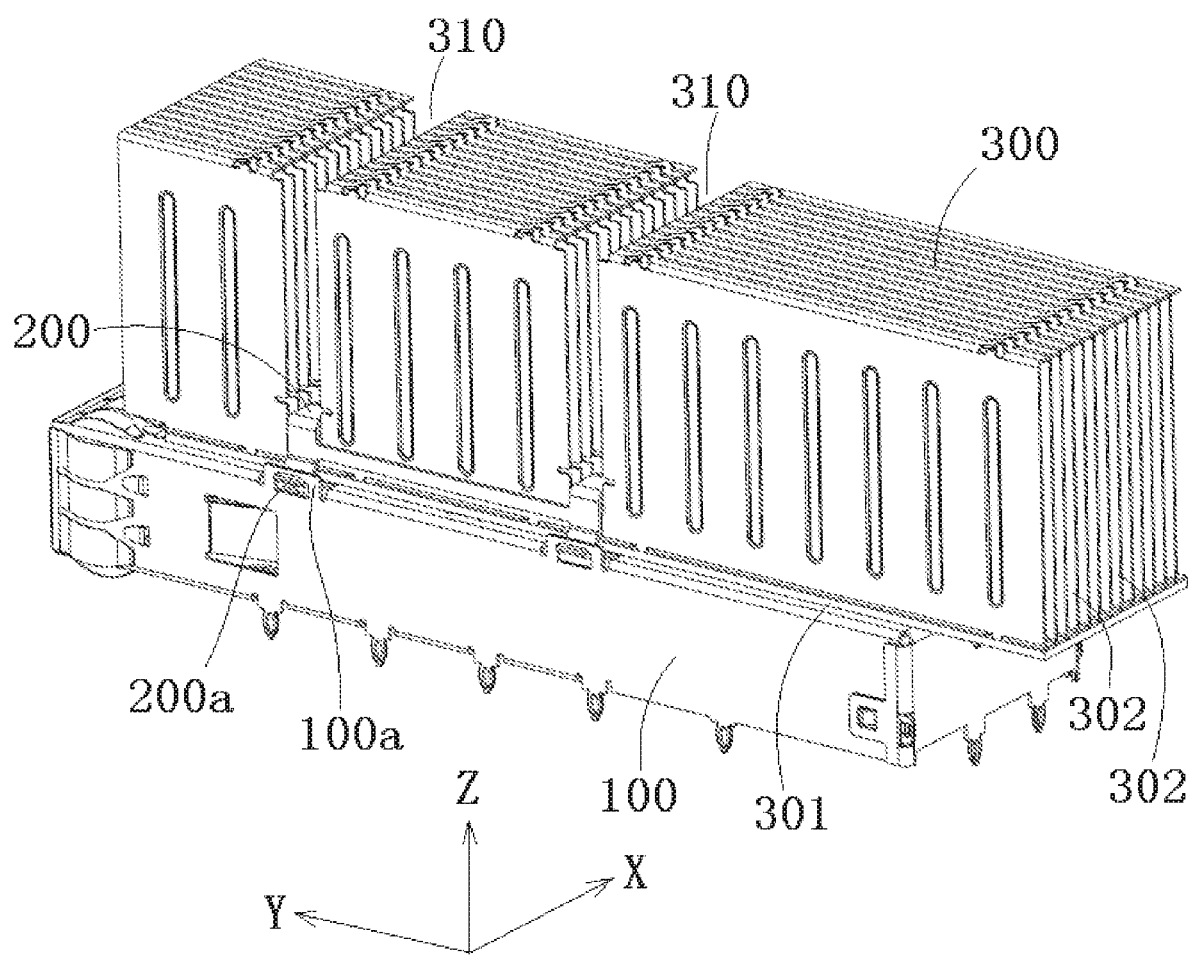
FIG. 1 is a perspective view of a connector according to an embodiment without a sealing cover.

Exemplary embodiments of the present disclosure will be described hereinafter in detail with reference to the attached drawings, wherein like reference numerals refer to like elements. The present disclosure may, however, be embodied in many different forms and should not be construed as being limited to the embodiment set forth herein; rather, these embodiments are provided so that the present disclosure will convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 3:
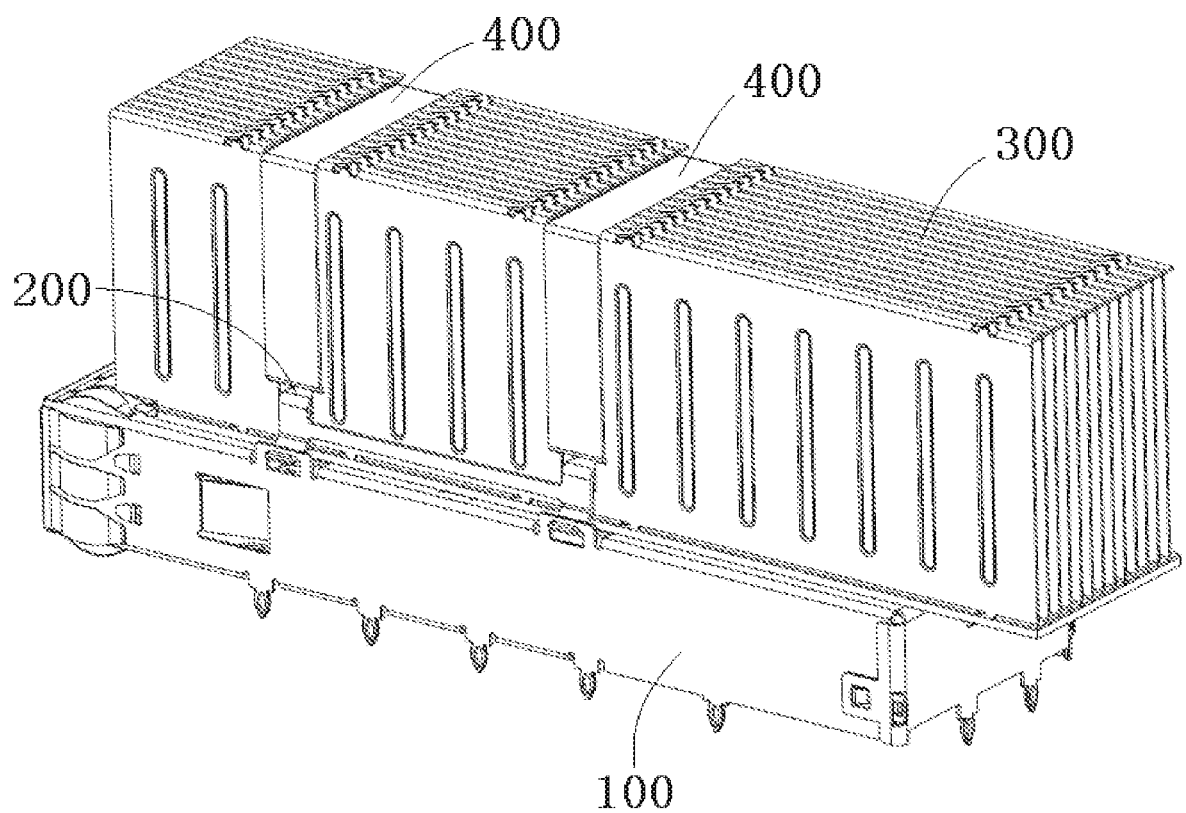
FIG. 3 is a perspective view of the connector with the sealing cover.

A connector according to an embodiment, as shown in FIGS. 1 and 3, includes a cage 100, a radiator 300, and a clip 200. The radiator 300 is disposed on a top wall of the cage 100. The clip 200 is adapted to be locked to the top wall of the cage 100, so as to elastically press the radiator 300 on the top wall of the cage 100.

As shown in FIG. 1, the radiator 300 includes a base 301 mounted on the top wall of the cage 100 and a plurality of vertical fins 302 extending parallel to each other in a longitudinal direction Y of the radiator 300. A bottom of each of the vertical fins 302 is disposed on the base 301 and a top of each of the vertical fins 302 are connected with each other; a gap is formed between two adjacent vertical fins 302 to allow airflow to pass there through. In an embodiment, the fins 302 extend longitudinally from a front end of the cage 100 toward a back end thereof. The gap between two adjacent vertical fins 302 are closed at the bottom side and the top side thereof and opened at the front side and the back side thereof. In an embodiment, one or more fans which are provided nearby may be configured to direct air through the gaps. The air absorbs thermal energy from the fins and transfers the thermal energy away from the connector.

The fins 302 may be manufacturing using at least one of a bonding process, a skiving or scarfing process, an interlocking process, or a folding process. Bonded fins 302 include discrete fins 302 that are secured to a common base 301. Each of the fins 302 may be stamped from sheet metal and attached to the base 301. The base 301 may be machined or extruded to form, for example, slots that receive the fins 302. The fins 302 may be attached by an adhesive, welding process, soldering process, or other attachment methods.

In an embodiment, interlocked fins 302 may include discrete fins 302 that are directly attached to one another. A portion of one fin 302 may be folded to grip or otherwise directly attach to at least one other nearby fin 302. In this way, each of a series of fins 302 may be directly attached to at least one other nearby fin 302. The fins 302 may be shaped to enhance strength and/or structural integrity thereof. In an embodiment, the fin 302 may include one or more ribs that extend from a proximal surface of the fin 302 toward a distal surface of the fin 302. The rib may be configured to resist deformation of the fin 302. An interlocking mechanism may also enhance the strength and/or structural integrity of the series of the heat-transfer fins 302.

Figure 2:
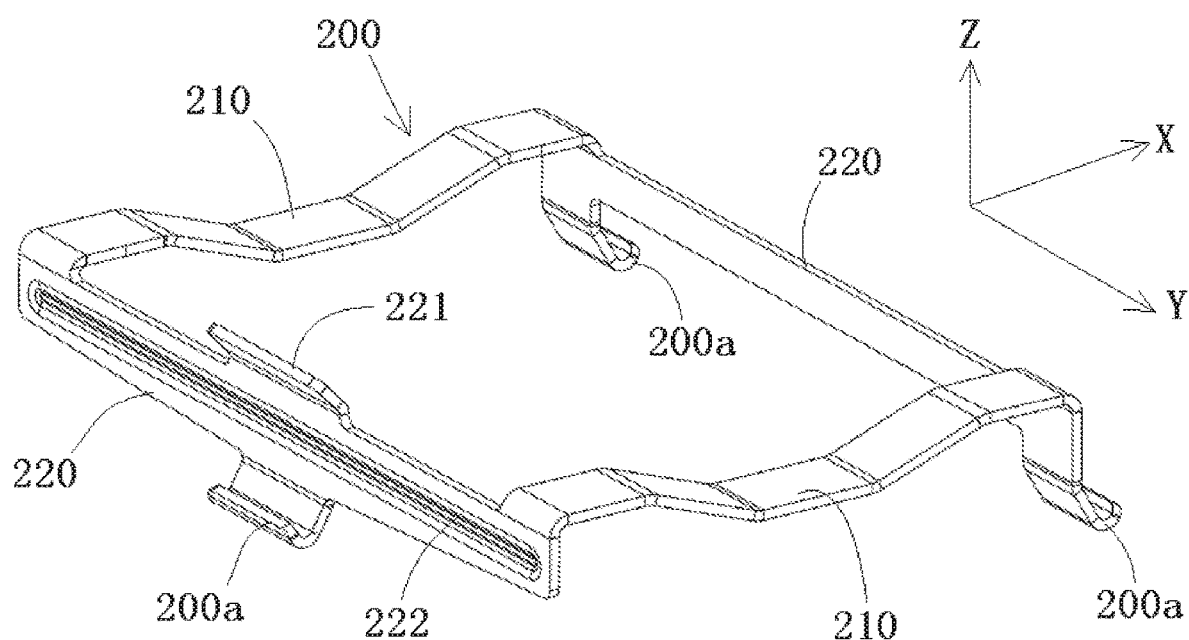
FIG. 2 is a perspective view of a clip of the connector.

As shown in FIGS. 1-3, the clip 200 includes an elastic lateral beam 210. A vertical slot 310 passing through the radiator 300 in a lateral direction X is formed in the radiator 300. The elastic lateral beam 210 is received in the vertical slot 310 to press the radiator 300 on the top wall of the cage 100. The design of the vertical slot 310 causes an opening in the gap between adjacent fins 302 of the radiator 300 and causes the heat dissipation airflow to leak.

Figure 4:
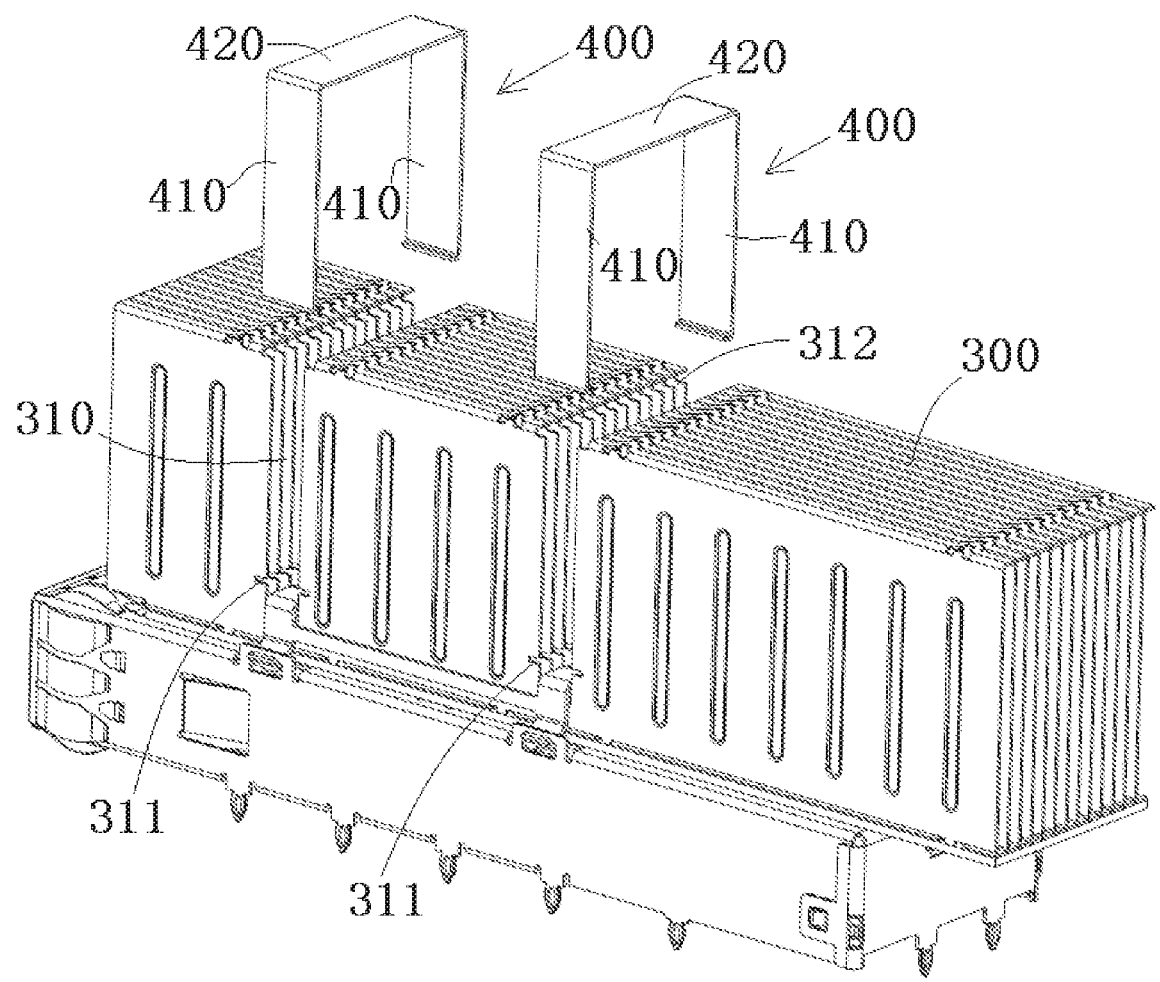
FIG. 4 is an exploded perspective view of the connector with the sealing cover.
Figure 5:
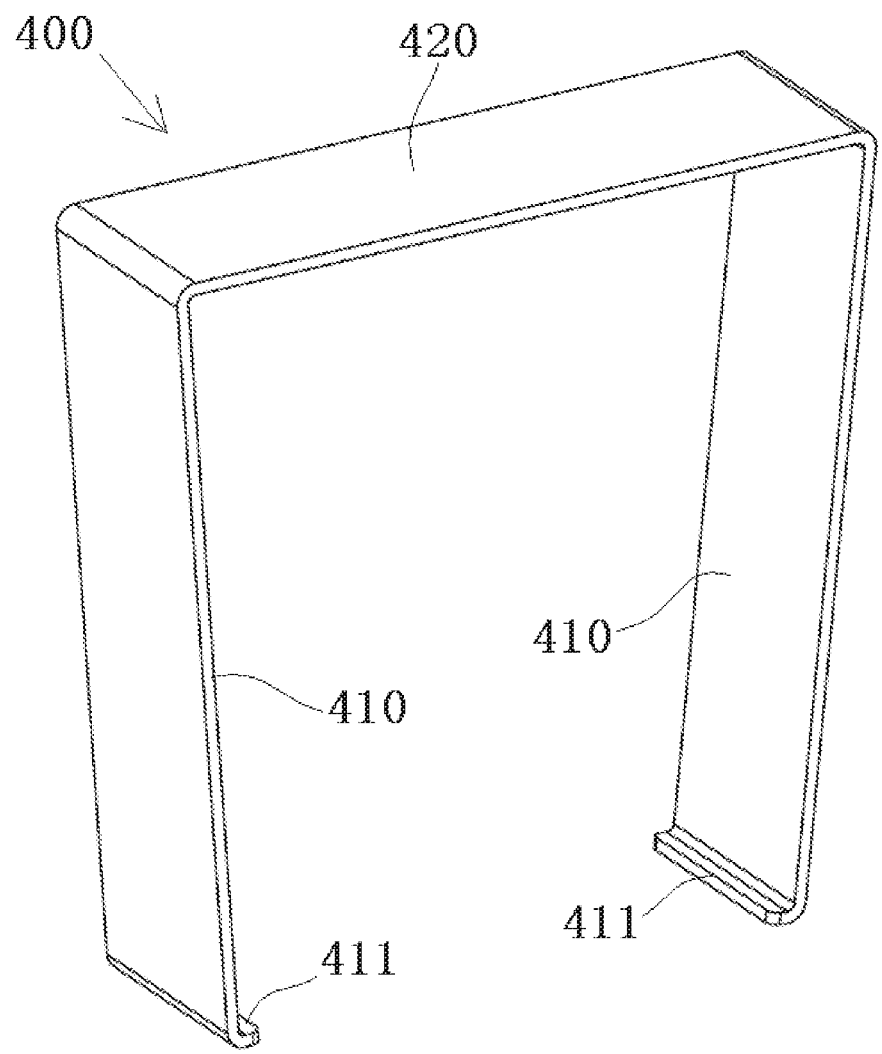
FIG. 5 is a perspective view of the sealing cover.

As shown in FIGS. 3-5, the connector comprises a sealing cover 400 mounted on the vertical slot 310 of the radiator 300 for partially or wholly sealing the vertical slot 310. The sealing cover 400 prevents the airflow from being leaked to the outside of the radiator 300 through the vertical slot 310, thus improving the heat dissipation effect of the radiator 300.

The sealing cover 400, as shown in FIGS. 3-5, has a substantially U-shaped cross-section and includes a pair of side plates 410 and a top plate 420 connected between the pair of side plates 410. The vertical slot 310 has two side openings opposite to each other in the lateral direction X and a top side opening. The pair of side plates 410 of the sealing cover 400 are configured to partially or wholly seal the two side openings of the vertical slot 310. The top plate 420 of the sealing cover 400 is configured to seal the top side opening of the vertical slot 310.

As shown in FIGS. 4 and 5, in an embodiment, the pair of side plates 410 of the sealing cover 400 are slightly tilted inward relative to a vertical plane (defined by a longitudinal direction Y and a vertical direction Z of the radiator 300) perpendicular to the lateral direction X of the radiator 300 before being mounted on the vertical slot 310 of the radiator 300. The pair of side plates 410 of the sealing cover 400 are elastically deformed outward to a position parallel to the vertical plane, as shown in FIG. 3, after being mounted on the vertical slot 310 of the radiator 300.

A horizontal slit 311 extending in the lateral direction X, as shown in FIG. 4, is formed at each side of the vertical slot 310 near the bottom of the vertical slot 310. An insertion portion 411, shown in FIG. 5, is formed by bending a lower end of each side plate 410, and the insertion portion 411 is adapted to be inserted into the horizontal slit 311 to fix the sealing cover 400 on the vertical slot 310. A horizontal supporting step 312 extending in the lateral direction X is formed at each side of the top opening of the vertical slot 310. An edge portion of the top plate 420 of the sealing cover 400 is supported on the horizontal supporting step 312.

In the embodiment shown in FIGS. 1-4, the clip 200 includes a pair of elastic lateral beams 210 and the radiator 300 has a pair of vertical slots 310. The pair of elastic lateral beams 210 are received in the pair of vertical slots 310, respectively. The clip 200 includes a pair of longitudinal beams 220 connected between the pair of elastic lateral beams 210. The pair of longitudinal beams 220 are located at both sides of the radiator 300 in the lateral direction X and adapted to be locked to the top wall of the cage 100.

As shown in FIGS. 1 and 2, a hook 200a is formed on each of the longitudinal beams 220. A latch 100a engaging the hook 200a is formed on the top wall of the cage 100, and the hook 200a and the latch 100a are adapted to be locked with each other.

As shown in FIG. 2, in an embodiment, at least one reinforcement rib 222 protruding inward or outward is formed on one of the pair of longitudinal beams 220. The reinforcement rib 222 extends from one end of the longitudinal beam 220 to the other end along the length (longitudinal) direction of the longitudinal beam 220. A pressing tab 221 is formed on one of the pair of longitudinal beams 220. The clip 200 is unlocked from the cage 100 by pushing the pressing tab 221. In an embodiment, the pressing tab 221 is located at the middle of the longitudinal beam 220 in the length direction thereof, and inclined toward the top wall of the cage 100.

What is claimed is:

1. A connector, comprising:
    a cage;
    a radiator disposed on a top wall of the cage and having a vertical slot extending through the radiator in a lateral direction of the radiator;
    a clip adapted to be locked to the top wall of the cage, the clip having an elastic lateral beam received in the vertical slot and adapted to press the radiator on the top wall of the cage; and
    a sealing cover mounted on the vertical slot and at least partially sealing the vertical slot, the sealing cover at least partially covering a portion of the elastic lateral beam of the clip arranged in the vertical slot.

2. The connector of claim 1, wherein the sealing cover has a pair of side plates and a top plate connected between the pair of side plates.

3. The connector of claim 2, wherein the vertical slot has a pair of side openings disposed opposite to each other in the lateral direction and a top side opening.

4. The connector of claim 3, wherein the pair of side plates at least partially seal the pair of side openings and the top plate seals the top side opening.

5. The connector of claim 4, wherein the pair of side plates are tilted inward relative to a vertical plate perpendicular to the lateral direction of the radiator before being mounted on the vertical slot.

6. The connector of claim 5, wherein the pair of side plates are elastically deformed outward to a position parallel to the vertical plane after being mounted on the vertical slot.

7. The connector of claim 4, wherein the radiator includes vertical fins defining a horizontal slit disposed on each side of the vertical slot near a bottom of the vertical slot and extending in the lateral direction.

8. The connector of claim 7, wherein a lower end of each of the side plates is bent into an insertion portion adapted to be inserted into the horizontal slit to fix the sealing cover on the vertical slot.

9. The connector of claim 8, wherein a horizontal supporting step extending in the lateral direction is disposed at each side of the top side opening of the vertical slot.

10. The connector of claim 9, wherein an edge portion of the top plate of the sealing cover is supported on the horizontal supporting step.

11. The connector of claim 1, wherein the radiator includes a base and a plurality of vertical fins extending parallel to each other in a longitudinal direction of the radiator.

12. The connector of claim 11, wherein a bottom of each of the vertical fins is disposed on the base and a top of each of the vertical fins are connected with each other, a gap is disposed between a pair of adjacent vertical fins to allow airflow to pass therethrough.

13. A connector, comprising:
   a cage;
   a radiator disposed on a top wall of the cage and having a vertical slot extending through the radiator in a lateral direction of the radiator;
   a clip adapted to be locked to the top wall of the cage, the clip having an elastic lateral beam received in the vertical slot and adapted to press the radiator on the top wall of the cage, wherein the clip includes a pair of elastic lateral beams and the radiator has a pair of vertical slots, the pair of elastic lateral beams are each received in one of the pair of vertical slots; and
   a sealing cover mounted on the vertical slot and at least partially sealing the vertical slot.

14. The connector of claim 13, wherein the clip includes a pair of longitudinal beams connected between the pair of elastic lateral beams.

15. The connector of claim 14, wherein the pair of longitudinal beams are disposed at opposite sides of the radiator in the lateral direction and adapted to be locked to the top wall of the cage.

16. The connector of claim 15, wherein each of the longitudinal beams has a hook engaging and locking with a latch formed on the top wall of the cage.

17. The connector of claim 16, wherein one of the pair of longitudinal beams has a reinforcement rib protruding inward or outward, the reinforcement rib extends from a first end of the longitudinal beam to a second end of the longitudinal beam along a length direction of the longitudinal beam.

18. The connector of claim 16, wherein one of the pair of longitudinal beams has a pressing tab, the clip is adapted to be unlocked from the cage by pushing the pressing tab.

19. The connector of claim 18, wherein the pressing tab is disposed in a middle of the longitudinal beam in the length direction of the longitudinal beam and inclined with respect to the top wall of the cage.

20. A radiator adapted to be mounted on a cage of a connector, comprising:
   a base;
   a plurality of vertical fins extending parallel to each other in a longitudinal direction of the radiator; and
   a vertical slot extending through the vertical fins in a lateral direction of the radiator, the vertical slot has a pair of side openings disposed opposite to each other in the lateral direction and a top side opening, a bottom of each of the vertical fins is disposed on the base and a top of each of the vertical fins are connected with each other, a gap is disposed between a pair of adjacent vertical fins to allow airflow to pass therethrough, the vertical slot is configured to receive a clip to lock the radiator to the cage and a sealing cover of the connector is mounted on the vertical slot to at least partially seal the vertical slot, the sealing cover has a pair of side plates and a top plate connected between the pair of side plates, the pair of side plates at least partially seal the pair of side openings and the top plate seals the top side opening.

* * * * *